(12) United States Patent
Braun (10) Patent No.: US 10,785,886 B2
(45) Date of Patent: Sep. 22, 2020

(54) SYSTEM, APPARATUS, AND METHOD FOR PROVIDING A PROGRAMMABLE LOGIC CONTROLLER

(71) Applicant: Braun Research Corporation, Alta Loma, CA (US)

(72) Inventor: Kurt Braun, Alta Loma, CA (US)

(73) Assignee: Braun Research Corporation, Alta Loma, CA (US)

( * ) Notice: Subject to any disclaimer, the term of this patent is extended or adjusted under 35 U.S.C. 154(b) by 93 days.

(21) Appl. No.: 15/291,409

(22) Filed: Oct. 12, 2016

(65) Prior Publication Data

US 2017/0105307 A1     Apr. 13, 2017

Related U.S. Application Data

(60) Provisional application No. 62/240,827, filed on Oct. 13, 2015.

(51) Int. Cl.
*H05K 7/14*     (2006.01)
*G06F 1/18*     (2006.01)

(52) U.S. Cl.
CPC ........... *H05K 7/1474* (2013.01); *G06F 1/184* (2013.01)

(58) Field of Classification Search
CPC .... H05K 7/1474; H01R 12/7076; H01R 9/26; H01R 9/2608; G06F 1/184
USPC ................................................. 439/532, 716
See application file for complete search history.

(56) References Cited

U.S. PATENT DOCUMENTS

| | | | | |
|---|---|---|---|---|
| 3,665,376 A | * | 5/1972 | Paris | H01R 9/24 439/721 |
| 4,577,187 A | * | 3/1986 | Barr | G06F 1/189 108/5 |
| 5,145,418 A | * | 9/1992 | Moranski | H01R 9/2608 439/712 |
| 5,649,829 A | * | 7/1997 | Miller | H01R 9/24 439/49 |

(Continued)

OTHER PUBLICATIONS

Rockethacker, DIN Rail Vert PCB Mount, Thingiverse, Oct. 30, 2013, https://www.thingiverse.com/thing:173908. (Year: 2013).*

(Continued)

*Primary Examiner* — Jonathan Liu
*Assistant Examiner* — Guang H Guan
(74) *Attorney, Agent, or Firm* — John J. Bamert, Esq.; Mark P. Walters, Esq.; Lowe Graham Jones PLLC (57) ABSTRACT

A mounting device for a consumer grade controller that allows for installation in an industrial application with reliability improvement features. The consumer grade controller is mounted to the mounting device using screws and standoffs, which securely fasten the consumer grade controller to the mounting device. The mounting device is compatible with an industry standard DIN rail allowing for easy installation and removal. The mounting device positions the consumer grade controller vertically with respect to the DIN rail to provide improved cooling and reduce DIN rail space. A power cable is secured with a built-in strain relief feature and held in place with a tie wrap to maintain pressure on the cable and preventing it from accidentally releasing. The mounting device, standoffs, and strain relief feature can be injected molded in one assembly for low cost manufacturing while still providing all the benefits that an industrial application requires.

14 Claims, 7 Drawing Sheets

(56) References Cited

U.S. PATENT DOCUMENTS

| | | | | |
|---|---|---|---|---|
| 5,825,635 | A * | 10/1998 | Mukoyama | H05K 1/0271 361/826 |
| 5,978,232 | A * | 11/1999 | Jo | H05K 7/142 211/41.17 |
| 6,210,178 | B1 * | 4/2001 | DeForest, Jr. | H01R 12/721 439/76.1 |
| 6,991,494 | B1 * | 1/2006 | Spink, Jr. | H01R 13/745 439/607.27 |
| 7,234,958 | B1 * | 6/2007 | Copus | H01R 12/7076 439/371 |
| 7,500,867 | B1 * | 3/2009 | Doglio | H01R 13/5812 248/251 |
| 8,902,611 | B2 * | 12/2014 | Bridges | H05K 7/1007 361/807 |
| 8,903,216 | B2 * | 12/2014 | Thompson | H02G 15/007 385/136 |
| 8,937,814 | B2 * | 1/2015 | Tu | G06F 1/184 174/138 E |
| 8,953,924 | B2 * | 2/2015 | Cote | G02B 6/4471 385/135 |
| 9,042,702 | B2 * | 5/2015 | Rodriguez | G02B 6/36 385/136 |
| 9,110,267 | B2 | 8/2015 | Fabrykowski et al. | |
| 9,130,308 | B2 | 9/2015 | Wang et al. | |
| 9,753,239 | B2 * | 9/2017 | Allen | G02B 6/4471 |
| 2017/0105307 | A1 * | 4/2017 | Braun | G06F 1/184 |

OTHER PUBLICATIONS

Italtronic, Part No. 25.0410000.RPI, Jun. 2014, Padova, Italy.
Italtronic, Part No. 10.0012225.RMB, Jun. 2014, Padova, Italy.
duinocases.com, Part No. duinoCases-B+, Feb. 2012, Salt Lake City, UT, US.
Thingiverse, http://www.thingiverse.com/thing:500504, Oct. 2014, Brooklyn, NY, US.
Kurt Braun, https://youtu.be/_MeQBfQObgk, Jan. 21, 2014, Alta Loma, CA, US.
Kurt Braun, https://youtu.be/Nzi0NBb9ZVE, Oct. 3, 2014, Alta Loma, CA, US.

* cited by examiner

SYSTEM, APPARATUS, AND METHOD FOR PROVIDING A PROGRAMMABLE LOGIC CONTROLLER

PRIORITY CLAIMS

This patent application claims benefit of U.S. Provisional Application Ser. No. 62/240,827 filed on Oct. 13, 2015.

BACKGROUND OF THE INVENTION

Industrial controllers are designed for high reliability and are used in nearly every industry worldwide. Examples include; Industrial PCs (IPC's), Programmable Logic Controllers (PLC's), Motion Controllers, Data loggers, Human Machine Interfaces (HMI), SCADA systems, Man Machine Interfaces (MMI), Machine To Machine (M2M), Industrial Routers, Industrial Managed switches, Industrial Historians, Hardware Alarm Dialers, Inductive Variable Frequency Drives and Servo Drives. These purpose-built solutions can be costly, and in some applications are not economically viable. The advent of very low cost single board computers and controllers designed for consumer or prosumers present a compelling alternative to the typical industrial solutions available. One of the inherent problems of using a low-cost consumer controller in an industrial setting is how to reliably mount and power the board for installation in an electrical cabinet or enclosure. These boards are typically powered with USB (micro, mini, type A or type B) that can inadvertently be unplugged because the cable has no locking mechanism. An inadequate mount for the PCB might fail resulting in the part falling to the bottom of the panel. Either of these scenarios might occur during shipment of equipment from the location of manufacture to the customer location, or while the equipment is in operation. Both scenarios will require manual intervention to remedy and result in unexpected down time of the equipment and a potential economic cost associated with the down time.

SUMMARY OF THE INVENTION

An embodiment of the invention relates to a system, apparatus, and method for securing a controller PCB in an industrial electrical panel by providing several features beneficial in an industrial environment. The controller is attached to a standard DIN (Deutsche Industrie Normen) rail mounting system commonly used in industry. Presently, DIN rail is standard in many electrical designs, and allows for the easy installation of common components by attachment to the rail. By incorporating clips that are compatible with this standard, the installation of consumer grade controllers becomes much more accessible. In this case, the arrangement of the DIN rail to the controller PCB is such that it is positioned normal to the length of the DIN rail, minimizing lengthwise DIN rail allocation to allow more space for other devices. Furthermore, the position of the PCB is extended relative to the substantially planar mounting surface the PCB further away from the substantially planar mounting surface to allow for more ventilation and convection of heat generated by the board components. The controller PCB is conveniently mounted to the DIN mount body using provided standoffs with holes that align with the PCB mounting holes and proper screw sizes. This ensures optimum conditions for mounting of the controller PCB. The standoffs are of sufficient size to provide adequate cooling in the space between the board and the substantially planar mounting surface, while the surface of the board opposite with respect to the side facing the mount is optionally also exposed for additional cooling through unrestricted convection unless a cover is used. The electrical power for the controller PCB is typically micro USB, therefore the mount provides a built in strain relief feature which is positioned in close proximity to the USB plug body for securing with a common tie wrap. This prevents accidental removal of the power/communications plug because the tie wrap substantially reduces movement of the micro USB connector. Additional tie wrap attachment point(s) provide further strain relief of the USB cable, in the event the cable is pulled with more than enough force to overcome first tie wrap. Alternatively, the mount can be made of metal, or grounding wires can be employed to the PCB board screws to provide a ground plane to the controller PCB in addition to the ground provided by the power connector.

BRIEF DESCRIPTION OF THE DRAWINGS

Preferred and alternative examples of the present invention are described in detail below with reference to the following drawings.

DETAILED DESCRIPTION OF THE PREFERRED EMBODIMENT

Figures 1A, 1B:
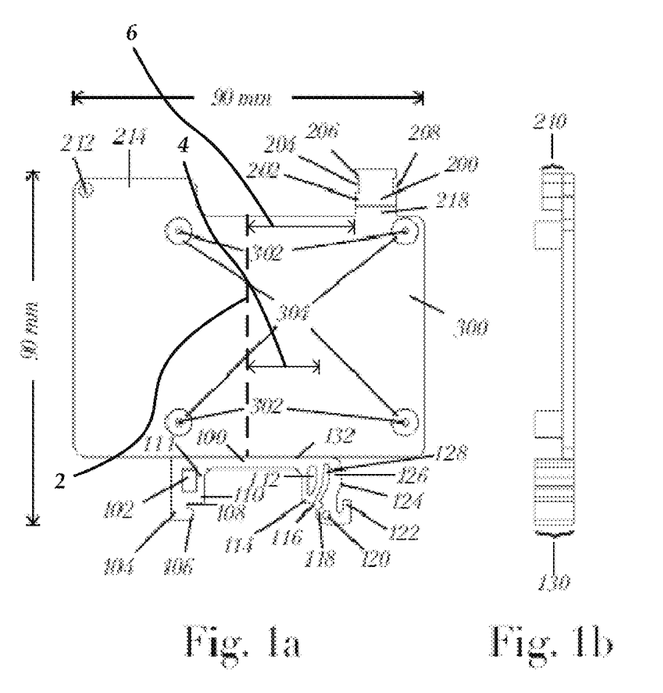
FIG. 1a is a front planar view of an embodiment useable according to the principles of the present invention.
FIG. 1b is a side planar view of an embodiment useable according to the principles of the present invention.

As seen in the front planar view of FIG. 1, the mounting device for a consumer grade controller PCB is shown. The illustrative embodiment shows the PCB mount body contains standoffs 304 with holes 302 for screwing the PCB controller securely. A DIN mounting feature 100 is provided for attachment to a standard 35mm DIN rail. Two clips extend to attach to the DIN rail, one rigid 104 and one flexible 126. The DIN rail engages the DIN mounting feature at the rigid DIN clip 104 and the flexible DIN clip 126. Two inward facing contact surfaces relative to the substantially planar mounting surface of the DIN rail, rigid 110 and flexible 114 sides, provide a contact surface for the top of the DIN rail. The other outward facing contact surfaces relative to the substantially planar mounting surface of the DIN rail is found in the outward facing contact surface rigid DIN clip 106, and outward facing contact surface of the flexible DIN clip 118. The flexible DIN clip 126, can move a few millimeters because the gap 128 allows the material to bend according to its natural K factor. The gap 128 and thickness of the flexible DIN clip 126 are selected to achieve the required holding force of the weight of the controller PCB, screws, tie wraps, memory card and any peripheral cables attached, while still being flexible enough to remove and attach to the DIN rail using a tool 900 for leverage if needed. Air gaps are positioned in the rigid DIN clip 102, flexible DIN clip 120 & inward facing contact surface DIN clip 112 to allow for maximum allowable thickness of injection-molded plastic, Nylon 66. The micro USB cable 800 is supported by an integrated strain relief feature 200. Ridges on the front 202 and back 206 restrict motion of a tie wrap 600 in the provided channel at the left side 204, right side 208 and rear 216. When the tie wrap 600 is securely fastened, it will prevent accidental removal. An optional strain relief hole 212 is provided as an additional strain relief and cable management feature. The labeling surface 214 can be used for easy identification of user information, such as IP address or device name As seen in the side planar drawing of Figure 1b, the illustrative embodiment shows the critical dimension shown 210 ensures surface-to-surface contact with the USB plug 800 and provided strain relief 200. The thickness of the DIN mount clip is such that it maintains adequate surface area contact with the DIN rail to prevent excessive forces on the inward facing contact surfaces 110, 114 generated from the torque created under the weight of the assembly components under the force of gravity when mounted on DIN rail.

Figure 1C:
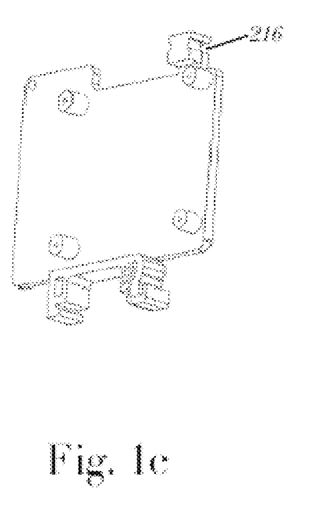
FIG. 1c is a perspective view of an embodiment useable according to the principles of the present invention.

As seen in the assembly drawing of Figure 1c, the illustrative embodiment shows the rear tie wrap channel which prevents the tie wrap from slipping off once secured in place around the USB plug.

Figure 2:
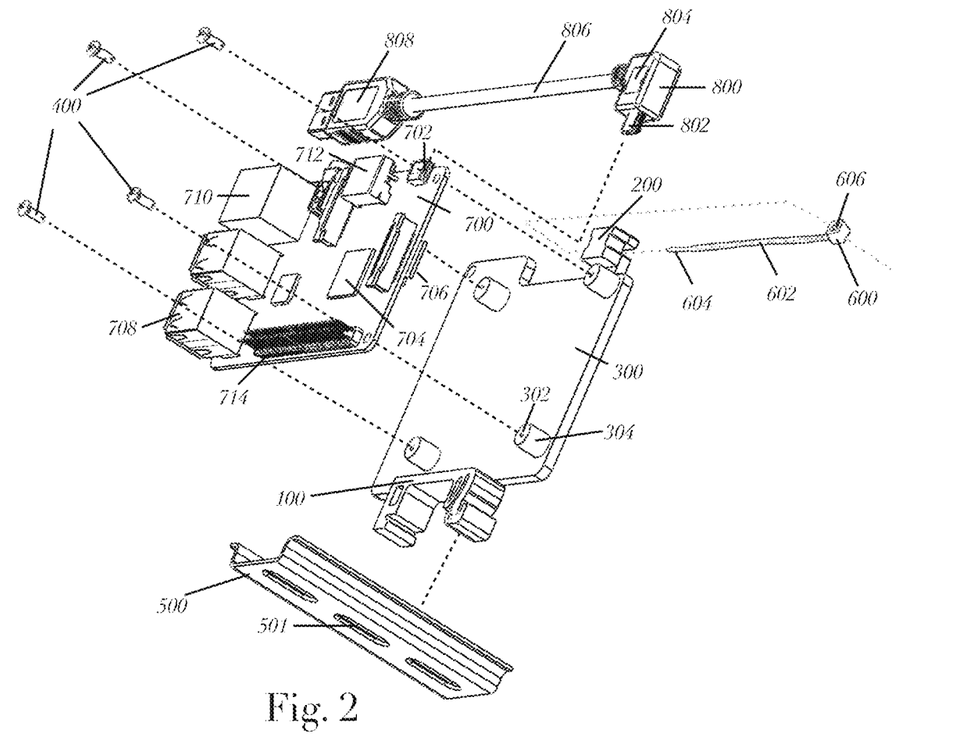
FIG. 2 is a perspective view of an assembly drawing for an embodiment useable according to principles of the present invention.

As seen in the assembly drawing of FIG. 2, the illustrative embodiment shows the mounting device 100, 200, 300 for a consumer grade controller is shown. In the illustrative embodiment, the device is useable for installation in an industrial application with reliability improvement features. Mounting device 100, 200, 300 is made of Nylon 66 polyamide, resistant to high voltage and chemicals common in industrial electrical enclosure environments. Materials other than plastic may be employed, such as metal or any other material that can be made to embody the spirit of the present patent. The controller PCB shown 700 contains onboard components typical of a single board computer, such as micro USB power jack 702, Central Processing Unit (CPU) 704, Flash memory for containing the operating system and custom applications 706, USB plugs for peripherals 708, RJ45 Ethernet jack for communications 710, HDMI video port 712 and General Purpose IO (GPIO) 714. The controller board shown is a typical consumer grade controller named the Raspberry Pi, and is shown only as an example, and is not limited to the Raspberry Pi as many other controller PCB's would also benefit from the features provided in this industrial DIN mount. The board is secured with screws 400, which align with the provided stand offs 304 and screw holes 302 in the PCB mount body 300. The USB cable 800 jack 802 plugs directly into the controller PCB 700 via the micro USB jack 702. Once connected a tie wrap 600 can be secured in the strain relief channels 204, 208, 216. The tie wrap tapered end is fed back into the tie wrap locking mechanism 606, which is secured by the tie wrap teeth 602 engaging with the locking mechanism 606. An industrial 35 mm DIN rail 500 is mounted to the electrical panel using the slots 501 in the DIN rail. Some DIN rail is not slotted and holes need to be drilled to provide a securing means to the electrical panel. While this illustration shows 35 mm DIN rail, other securing mechanisms and standards could be employed to achieve the same result, with the goal being compatibility with the chosen industrial mounting standard. Once the DIN rail is secured to the panel, the DIN mount clip 100 can be attached.

Figure 3:
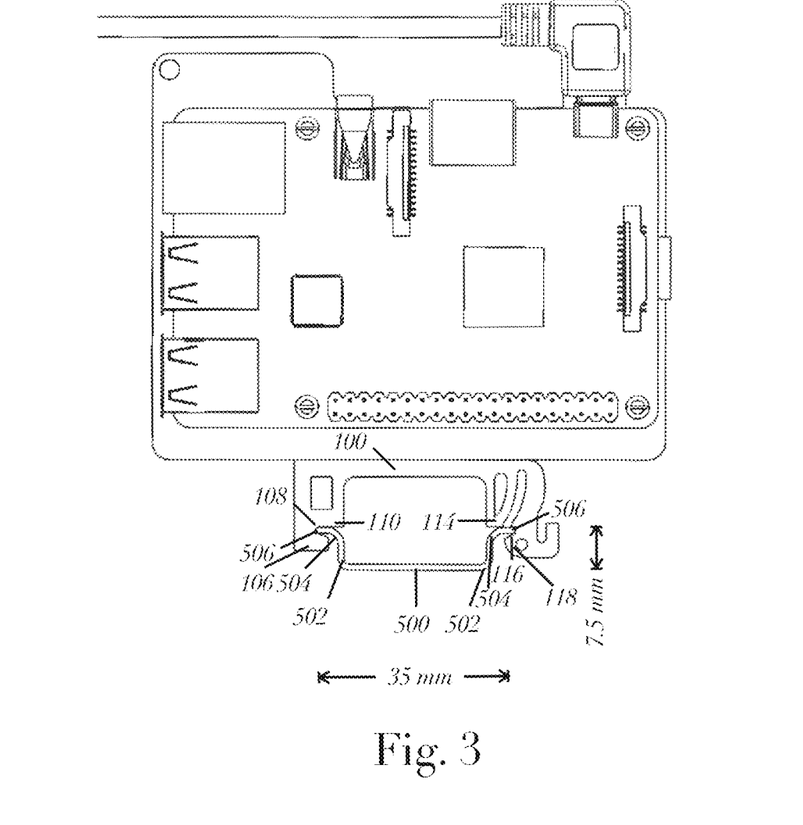
FIG. 3 is a front planar view of an embodiment useable according to principles of the present invention.

As seen in the assembly drawing of FIG. 3, the illustrative embodiment shows the orientation of the DIN rail 500 with the DIN rail clip 100. The DIN rail is typically fabricated in stamped metal, and contains four bends to create the desired profile required for mounting devices. The inner 90 degree bends 502 create a gap between the DIN rail mounting surface 500 and the outer 90 degree bends 504 to allow the outward facing contact surfaces access 106, 118 to the inward facing side of the DIN rail ends 506. The DIN rail 500 shown is 7.5 mm height, but other DIN heights are also acceptable and will work with the intent of the present patent. The distance between the two notches, the rigid notch 108 and the flexible notch 116 is approximately 0.2 mm less than the 35 mm width of the DIN rail to maintain constant pressure on the rail ends 506 against the rear of the notches 108 & 116. The inward facing contact surfaces on the rigid DIN clip 110 and flexible DIN clip 114 make surface to surface contact with the DIN rail 500, and help to distribute the load generated under the weight of the PCB, DIN mount and any cables connected.

Figure 4:
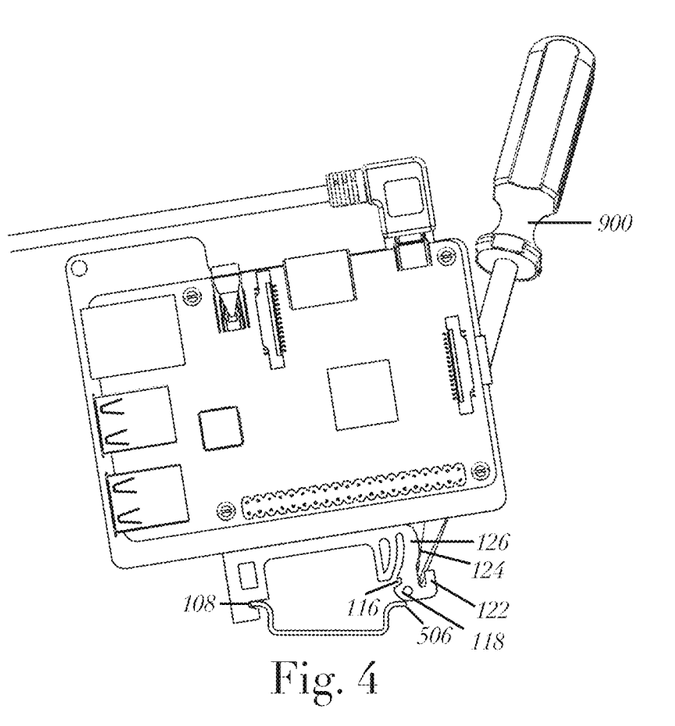
FIG. 4 is a front planar view of an embodiment useable according to principles of the present invention, showing removal and attachment using a tool.

As seen in the assembly drawing of FIG. 4, the illustrative embodiment shows the orientation of a tool 900 used to insert into DIN tool attachment point 122. The straight shaft of the tool 900, makes contact with the leverage feature 124 in the flexible DIN clip 126 to assist in overcoming the k constant in the plastic enough that the flexible DIN notch 116 can release the DIN rail edge 506. This procedure can be performed in reverse to assist in installing the DIN mount 100, 200, 300 onto the DIN rail 500, ensuring that the DIN rail edge 506 is fully inserted into the rigid DIN clip notch 108 first. Alternatively, force applied to the DIN mount device in the direction of the DIN rail will cause the flexible DIN clip to bend under the load due to contact of the DIN rail edge 506 with the curved surface of the flexible DIN clip 118.

Figure 5:
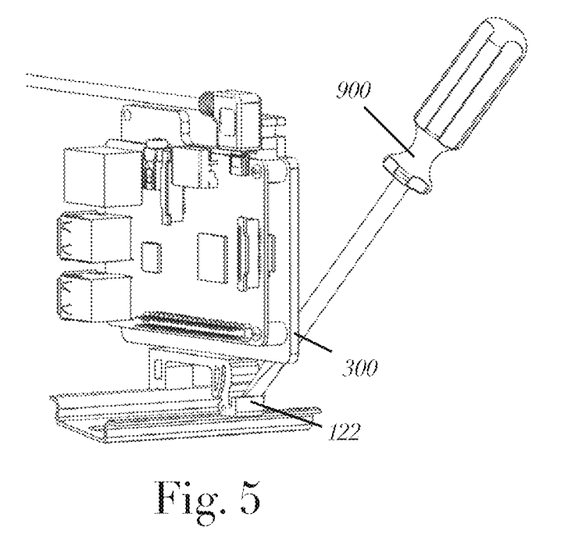
FIG. 5 is a perspective view of an assembly drawing for an embodiment useable according to principles of the present invention, showing removal and attachment using a tool.

As seen in the assembly drawing of FIG. 5, the illustrative embodiment shows the orientation of the tool 900 at a slight angle necessary to clear the PCB mount body 300, while still making adequate contact with the tool attachment point 122.

Figure 6:
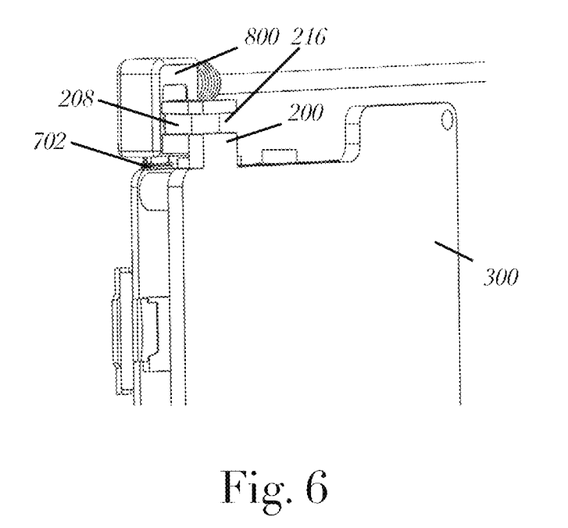
FIG. 6 is a rear planar view of an embodiment useable according to principles of the present invention, showing strain relief feature without tie wrap.

As seen in the assembly drawing of FIG. 6, the illustrative embodiment shows the orientation of the mated micro USB cable 800 with the controller USB jack 702. In this position, the rear tie wrap channel 216 and right tie wrap channel 208 can be seen in relation to the micro USB cable body 800. The Strain relief feature 200 is attached to the PCB mount 300, in this case molded in the same plastic housing, but could be fashioned from two pieces fastened together by some means.

Figure 7:
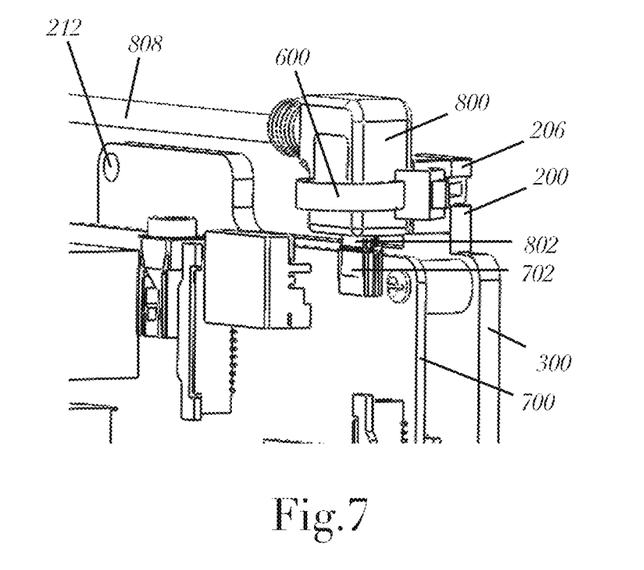
FIG. 7 is a front planar view of an embodiment useable according to principles of the present invention, showing strain relief feature with tie wrap.

As seen in the assembly drawing of FIG. 7, the illustrative embodiment shows the orientation of the mated micro USB cable 800 with the controller USB jack 702 and secured by tie wrap 600. This shows how the tie wrap completely encircles both the micro SUB body 800 and the strain relief feature 200, creating more secure connection than relying solely on the mating surfaces of the micro USB jack 702 and micro USB plug 802. The USB cable 808 can also be fastened to the secondary attachment point 212 with a tie wrap, or other fastener. While this example shows a micro USB cable, any cable or wire(s) can benefit from the strain relief feature presented by greatly reducing the chance of unintentional disconnects by providing a physical pressure between the plug housing 800 and mount 200 by the force of the tie wrap 200.

LIST OF REFERENCE SYMBOLS

100 DIN Mount feature
102 Gap required for injection molding (rigid DIN clip)
104 Rigid DIN clip
106 Outward facing contact surface relative to the substantially planar mounting surface on rigid DIN clip
108 Notch on rigid DIN clip to receive edge of DIN rail
110 Inward facing relative to the substantially planar mounting surface contact surface of rigid DIN clip
111 Support structure of rigid DIN clip
112 Gap required for injection molding (flexible DIN clip)
114 Inward facing relative to the substantially planar mounting surface contact surface of flexible DIN clip
116 Notch on flexible DIN clip
118 Outward facing relative to the substantially planar mounting surface contact surface on flexible DIN clip
120 Gap required for injection molding
122 Tool attachment point
124 Leverage feature
126 Flexible DIN clip
128 Flex gap for flexible DIN clip
130 Optimum thickness
132 Attachment point between PCB mount body and DIN mount feature
200 Strain relief feature
202 Forward ridge
204 Tie wrap channel (left)
206 Rear ridge
208 Tie wrap channel (right)
210 Optimum thickness to provide contact with intended plug housing
212 Secondary attachment point
214 Labeling surface
216 Tie wrap channel (rear)
218 Attachment point between DIN mount body and Strain relief feature
300 PCB mount body
302 PCB mount stand off screw holes
304 PCB mount stand offs
400 Screws
500 35 mm DIN Rail
501 DIN Rail slotted holes
502 DIN rail 90 degree bend(s) perpendicular to substantially planar mounting surface
504 DIN rail 90 degree bend(s) parallel to the substantially planar mounting surface
506 DIN rail mounting edge(s)
600 Tie wrap
602 Tie wrap ridges
604 Tie wrap tapered insertion end
606 Tie wrap locking mechanism
700 PCB/Controller/Single Board Computer
702 Power and/or communications jack (micro USB female)
704 Central Processing Unit (PCU)
706 Flash Memory (Micro SD)
708 Peripheral ports (USB/Serial Com)
710 RJ45 Ethernet port
712 HDMI video port
714 General Purpose IO (GPIO)
800 USB cable
802 Micro USB plug (male)
804 Micro USB body
806 Flexible cable
808 USB plug (external device)
900 Leverage tool While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A rail mount that mounts a single-board computer to a rail, the rail mount defining a support plane, a bottom surface of a printed circuit board of the single-board computer residing on the support plane when the printed circuit board is coupled to the rail mount, the rail mount comprising:
   a base member defining a longitudinal dimension, a lateral dimension, and a vertical dimension, the base member having a top surface and a bottom surface and including a first plurality of holes, the bottom surface of the base member being opposite the top surface of the base member from the printed circuit board when the printed circuit board is coupled to the rail mount, the printed circuit board having a second plurality of holes, the first plurality of holes arranged to be aligned with the second plurality of holes when the printed circuit board is coupled to the rail mount, the printed circuit board including at least one socket configured to receive a plug;
   a flexible mounting clip coupled to and extending away from the base member in a first direction that is substantially parallel to the lateral dimension, the flexible mounting clip having at least one notch configured to engage the rail, the rail extending substantially parallel to the vertical dimension when the at least one notch is engaged to the rail, the flexible mounting clip having a leverage feature and a tool contact point that is configured to flex the flexible mounting clip and cause the at least one notch to be disengaged from the rail responsive to a tool simultaneously pressing against the leverage feature and the tool contact point, the leverage feature and the tool contact point being positioned at least partially below the support plane by a vertical distance for allowing the tool to be disposed below the support plane when simultaneously pressing against the leverage feature and the tool contact point to cause the at least one notch to be disengaged from the rail; and
   a strain relief feature, wherein the strain relief feature includes a supporting surface, the supporting surface is configured to support the plug, and wherein the strain relief feature further includes at least one channel, and wherein the at least one channel is configured to receive a tie wrap.

2. The rail mount of claim 1, wherein the base member comprises a plurality of generally cylindrical stand-offs, the first plurality of holes extending through the plurality of generally cylindrical stand-offs as axial bores.

3. The rail mount of claim 2 wherein the plurality of generally cylindrical stand-offs each have an upper surface that is opposite the top surface of the base member from the bottom surface of the base member, the upper surfaces of all of the plurality of generally cylindrical stand-offs defining the support plane.

4. The rail mount of claim 3 wherein the top surface of the base member defines a first plane, and the strain relief feature extends substantially parallel to the vertical dimension from the first plane toward the support plane.

5. The rail mount of claim 4 wherein the leverage feature is rounded and extends along a majority of a length of the flexible mounting clip in the first direction.

6. The rail mount of claim 5 wherein the rail is a 35 mm DIN rail.

7. The rail mount of claim 1 wherein the flexible mounting clip is configured to be coupled to a 35 mm DIN rail.

8. A rail mount for mounting a printed circuit board of a single-board computer to a rail in an assembled state, the rail mount comprising:
 a base member including a plurality of stand-offs, the plurality of stand-offs defining a support plane and configured to support the printed circuit board in the assembled state with the printed circuit board residing on the support plane, the base member defining a longitudinal dimension, a lateral dimension, and a vertical dimension, the base member having a top surface and a bottom surface opposite the top surface, and the top surface defining a first plane and arranged to face the printed circuit board in the assembled state;
 a flexible mounting clip coupled to and extending away from the base member in a first direction that is substantially parallel to the lateral dimension, the flexible mounting clip having at least one notch configured to engage the rail in the assembled state, the flexible mounting clip having a leverage feature and a tool contact point, and the tool contact point configured to flex the flexible mounting clip in the assembled state and cause the at least one notch to be disengaged from the rail responsive to a tool simultaneously pressing against the leverage feature and the tool contact point; and
 a strain relief feature extending outside of a perimeter of the base member in a second direction opposite the first direction, the strain relief feature including a first exterior side, a second exterior side, and a third exterior side, the first exterior side defining a supporting surface configured to support at least one plug, the supporting surface disposed between the support plane and the first plane, the strain relief feature including a plurality of grooves defined by the second exterior side and the third exterior side, each of the plurality of grooves directly extending from the supporting surface, and the plurality of grooves configured to receive a tie wrap encircling the strain relief feature and the at least one plug.

9. The rail mount of claim 8 wherein each of the plurality of stand-offs is generally cylindrical and has an upper surface, the upper surfaces of all of the plurality of stand-offs defining the support plane.

10. The rail mount of claim 8 wherein each of the plurality of stand-offs defines an axial bore extending therethrough, the axial bore of each of the plurality of stand-offs arranged to be aligned with a corresponding mounting hole of the printed circuit board in the assembled state.

11. The rail mount of claim 8 wherein the flexible mounting clip is configured to be coupled to a 35 mm DIN rail.

12. The rail mount of claim 8 wherein the leverage feature and the tool contact point are positioned at least partially below the support plane by a vertical distance for allowing the tool to be disposed below the support plane in the assembled state and simultaneously press against the leverage feature and the tool contact point to cause the at least one notch to be disengaged from the rail.

13. The rail mount of claim 8 wherein the leverage feature is rounded and extends along a majority of a length of the flexible mounting clip in the first direction.

14. The rail mount of claim 8 wherein each of the plurality of grooves is defined by only three walls and has an opening opposite to one of the only three walls.

* * * * *